US007241635B1

(12) United States Patent
Osann, Jr.

(10) Patent No.: US 7,241,635 B1
(45) Date of Patent: Jul. 10, 2007

(54) BINNING FOR SEMI-CUSTOM ASICS

(76) Inventor: Robert Osann, Jr., 10494 Ann Arbor Ave., Cupertino, CA (US) 95014

( * ) Notice: Subject to any disclaimer, the term of this patent is extended or adjusted under 35 U.S.C. 154(b) by 0 days.

(21) Appl. No.: 10/704,850

(22) Filed: Nov. 10, 2003

Related U.S. Application Data

(60) Provisional application No. 60/426,051, filed on Nov. 13, 2002.

(51) Int. Cl.
H01L 21/44 (2006.01)
(52) U.S. Cl. .................... 438/14; 257/E21.525; 716/16
(58) Field of Classification Search ................. 438/14, 438/598; 716/16; 714/17; 257/E21.525, 257/E21.523
See application file for complete search history.

(56) References Cited

U.S. PATENT DOCUMENTS 6,060,330 A * 5/2000 Huggins et al. ............. 438/12

6,817,006 B1 * 11/2004 Wells et al. .................. 716/16
6,879,032 B2 * 4/2005 Rosenau et al. ............ 257/696

* cited by examiner

Primary Examiner—Caridad Everhart

(57) ABSTRACT

A binning method is disclosed for measuring semiconductor devices for certain parameters and placing specific devices into different categories or "bins" according to the measured parameters. Measurable parameters include performance/speed-grading, power consumption, current leakage, and the ability to operate at certain temperature extremes. A method for speed grading semi-custom ASIC devices is specifically described that does not require removing partially completed wafers from the fab line for testing. To speed-grade a new boat of partially completed un-customized wafers, a small number of wafers (1 or 2) are processed to completion while being customized specifically for a customer design requiring only the slowest bin. These wafer(s) are then performance tested and the remaining wafers in the boat are certified according to these results for their performance level and placed in a wafer bank for later use.

9 Claims, 4 Drawing Sheets

Wafer Flow for Binning

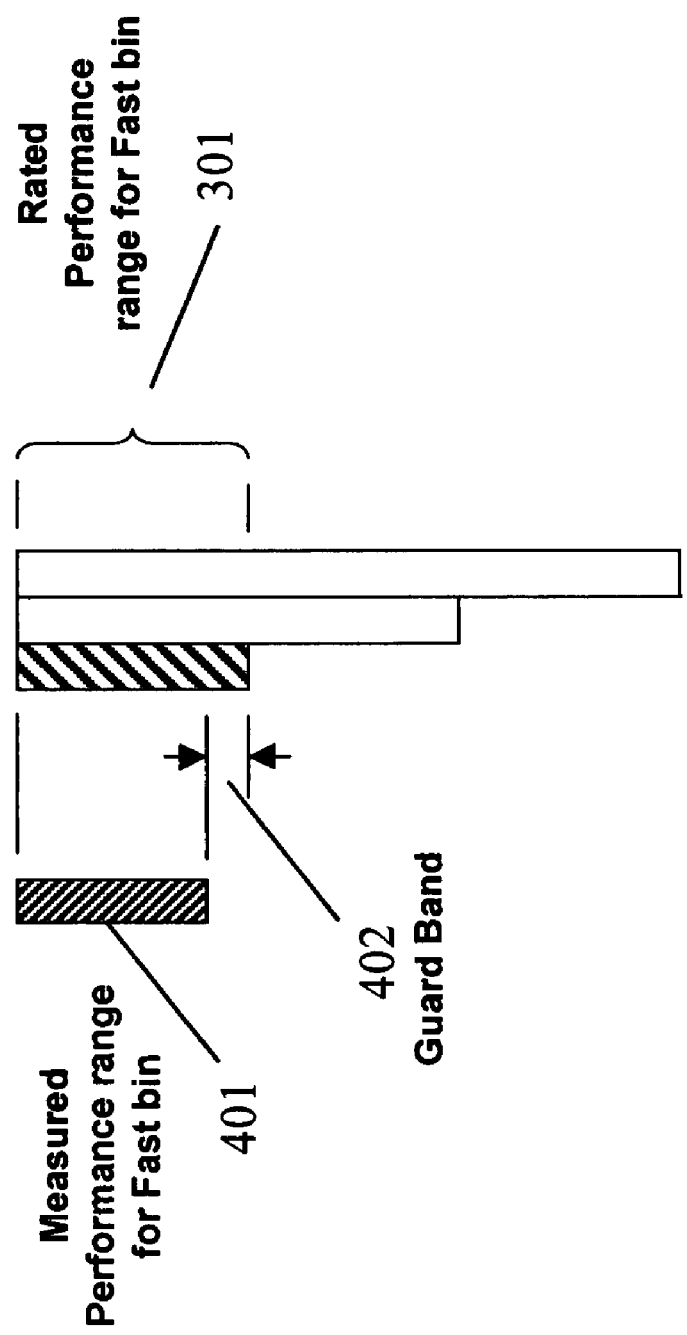

BINNING FOR SEMI-CUSTOM ASICS

CROSS REFERENCE TO RELATED APPLICATIONS AND DISCLOSURES

This application claims the benefit of U.S. Provisional Application Ser. No. 60/426,051, filed on Nov. 13, 2002, and entitled "Binning for semi-custom ASICs," commonly assigned with the present invention and incorporated herein by reference.

FIELD OF THE INVENTION

This invention relates to the field of Application Specific Integrated Circuits (ASICs), and in particular, methods and apparatus for binning relative to certain measurable parameters (performance/speed-grading, power consumption, current leakage, etc.) to enable a certain degree of functionality to be guaranteed when required. By way of example, the description is focused mostly on speed-grading.

BACKGROUND

In general, binning refers to measuring semiconductor devices for certain parameters and placing a specific device into different categories or "bins" according to the measured parameters. Most familiar of these methods are the speed grades offered on microprocessors such as Intel's Pentium processor which is offered in a number of speed-grades depending on the measured performance. Binning can also be performed for a variety of measurable parameters in addition to performance/speed-grading, such as power consumption, current leakage, or ability to operate at certain temperature extremes, to determine that a certain degree of functionality to be guaranteed when required.

Among digital semiconductor devices, standard products are often offered in a variety of speed grades (bins) at different prices—the higher performance devices selling for a premium. ASICs however, have never been offered in different speed grades, the assumption being that the performance of a completed device could fall anywhere within the overall process performance window. For Standard Cells, the type of ASIC that has grown the most in popularity over the last decade, this is certainly true. A standard cell requires all of the masks for the fabrication process to be custom for the particular customer application. Since these devices are custom for a particular customer's application, all the devices on a wafer must be purchased by that customer, hence there has never been a way to bin for Standard Cells.

However, there are other types of ASIC technology that that are semi-custom, that is they are partially prefabricated, requiring only the metal layers or a subset of the metal layers to be customized in order to adapt the ASIC devices to a particular customer application. Prior to this final customization, the devices on all such wafers are the same, regardless of the final customer application.

Semi-custom ASICs typically have all of the diffusion/poly layers and sometimes some or most of the metal layers in common for all the wafers in a boat (a boat is a group of wafers that are processed at the same time and/or under very similar conditions). As a result, most of the diffusion-related performance level, and some of the metal layer-related performance level, will essentially be common to all wafers in a boat since the diffusion layers and common metal layers were applied at the same time by the same equipment. Other parameters, such as power consumption and or current leakage, will also be similar for all wafers in a boat.

"Wafer banking" refers to storing partially completed ASIC wafers prior to application of whatever metal layers are required for final customization. Traditional Gate Arrays are banked prior to application of any metal layers, so the performance effect related to the metal layers on one wafer is not related to that of wafers that are metalized on a different day or using different equipment. However, it is known that most of the variation in performance between wafer runs is due to process variations in building the diffusion and poly layers as opposed to the metal layers. ASICs that have more metal layers applied prior to banking will show even less variation between wafers in a boat.

Little art exists for binning partially completed ASIC wafers as evidenced by U.S. Pat. Nos. 6,399,400 and 6,133,582 previously granted to this inventor. U.S. Pat. Nos. 6,399,400 and 6,133,582 refer to testing partially completed wafers before the final metal layers are applied. Unfortunately, in a typical semiconductor fab environment, this requires the wafers to be removed from the fab for testing and then re-introduced to the fab for final customization—a procedure that is impractical today. An alternate method is required for binning semi-custom ASICs, one that does not require wafers to be removed from the fab environment until all processing steps have been completed.

SUMMARY

A method for binning (speed grading) semi-custom ASIC devices is described that does not require removing partially completed wafers from the fab line for testing. To speed-grade a new boat of partially completed wafers, a small number of wafers (1 or 2) are processed to completion while being targeted specifically for a customer design requiring only the slowest bin. These wafer(s) are then performance tested using a binning circuit and the remaining wafers in the boat are certified according to these results for their performance level and assigned to a wafer bank for later use.

Binning can also be performed for a variety of measurable parameters in addition to performance/speed-grading, such as power consumption, current leakage, or ability to operate at certain temperature extremes, in order to determine that a certain degree of functionality will be guaranteed.

BRIEF DESCRIPTION OF THE DRAWINGS

The present invention is described with respect to particular exemplary embodiments thereof and reference is accordingly made to the drawings in which:

FIG. 4 shows how the performance rating for a particular bin may be assigned relative to the performance that is actually measured.

DETAILED DESCRIPTION OF THE INVENTION

Figure 1:
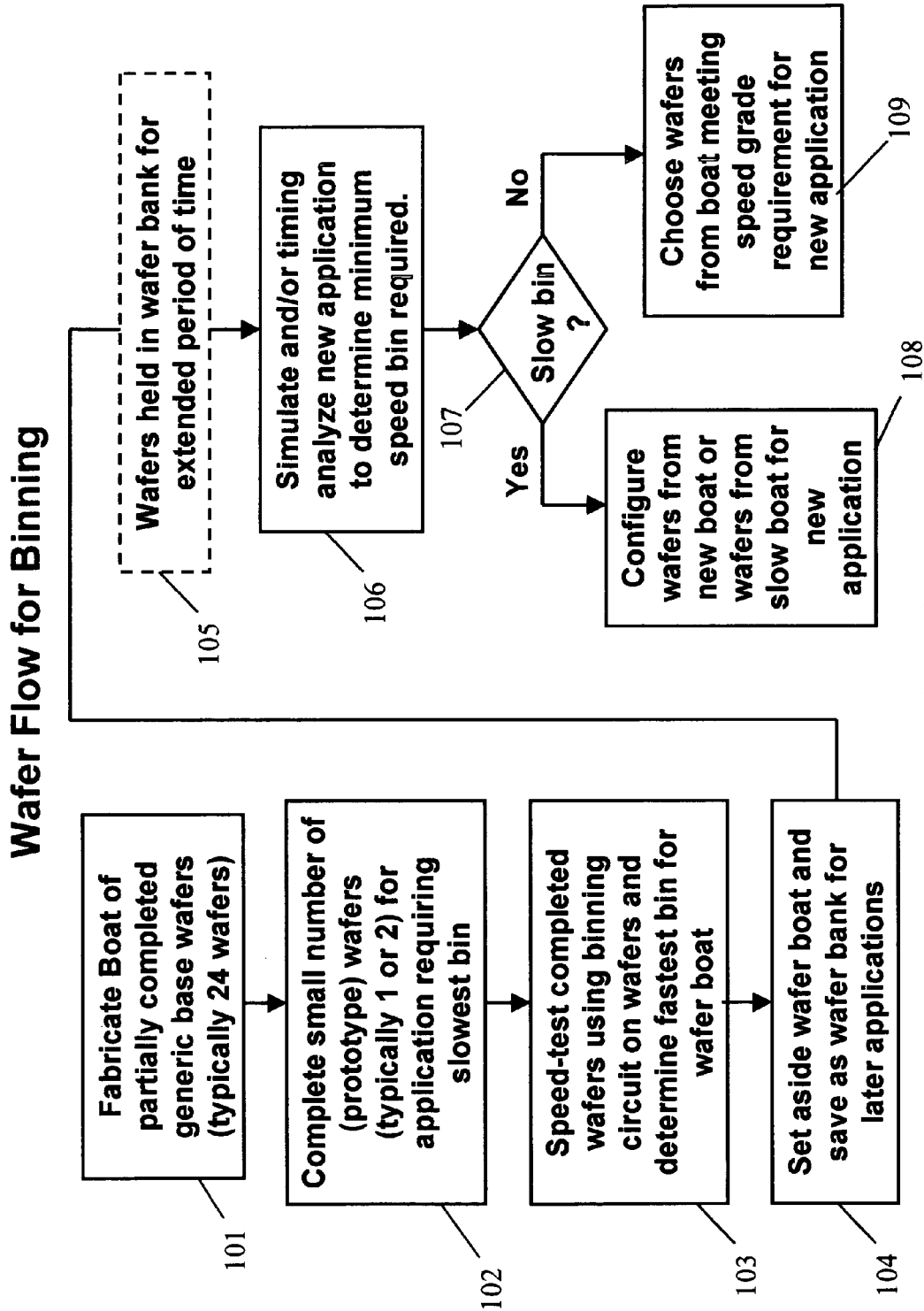
FIG. 1 shows a flow chart for the binning method according to this invention.

FIG. 1 shows a flow chart for the binning method of the present invention. In step 101 a boat (a boat is a group of wafers that are processed on the same equipment and in the same time-frame) of ASIC wafers (typically 24 or 25 wafers) is fabricated through whatever levels of processing are required to reach the point where base-wafers (partially completed, un-customized wafers) can be banked, prior to final customization. At this point, the performance level of this particular boat of partially completed wafers is not known, and only the lowest (least restrictive) performance level requirement for customer designs can be constructed with confidence that the requirement will be met. Therefore, in step 102, a small number of wafers (typically 1 or 2) is constructed, usually (but not necessarily) for a prototype requirement, and where the specific customer design requires only the slowest performance bin. In general terms, this would be a parameter requirement corresponding to the least restrictive bin, since all wafers produced are expected to fulfill the requirements of this parameter requirement. A circumstance where this small number of wafers is not for a prototype requirement would be where it is desired to identify a number of boats with a faster speed grade, and a small number of production wafers are customized from each of a plurality of boats of new partially completed wafers in order to characterize those boats. This circumstance would arise if there are not enough slow bin designs in the prototype design queue to enable the required number of faster speed boats to be characterized.

There may be any number of performance bins, the number being 2 or greater. This specification shows 3 bins as an example.

In step 103, this small number of wafers is performance tested. This may be done utilizing a binning (test) circuit contained on the wafer, or can alternately be done by testing a number of die using functional test patterns. The binning circuit, if present, may reside on each ASIC die, on special test die intermixed with ASIC die, or elsewhere on the wafer including the scribe lines. This performance test is used to determine the fasted speed bin that the wafer(s) are capable of meeting the requirements for. Also, if multiple wafers have been completed as a result of step 102, the results of step 103 can be compared among these multiple wafers to determine any degree of deviation between them and also the lower performance level of all, this lowest performance level being what will determine the performance level of the wafer boat and its bin assignment.

A binning circuit typically consists of some kind of active circuit whose delay is easily measured. This can be some kind of ring oscillator or alternately a logic circuit with a delay large enough to be measured with accuracy on the tester. For semi-custom ASICs, it may be useful to create a binning circuit that consists of transistors, poly connections, and whatever metal layers are applied and part of the generic (common to all applications) base wafer. The inputs and outputs of this binning circuit can be routed very directly through the customized final metal layers so that the performance of the binning circuit is very little affected by customization and therefore more accurately reflects the performance of the other wafers in the bin.

As a result of the tests performed in step 103, the particular boat of wafers is assigned to a specific performance bin and set aside 104 in a wafer bank for later use. Wafers may be kept 105 in the bank for an extended period of time.

When a customer requirement for devices arises, the customer will simulate the design or perform some form of timing analysis (a form of simulation) per step 106, utilizing a library containing the performance characteristics corresponding to different bins, and in doing so, determine the minimum performance bin required for the application. If the minimum performance required corresponds to the slow bin (step 107=Yes), wafers from a previously marked slow boat stored in the wafer bank can be used, or alternately, wafers from a new, uncharacterized boat may be used per step 108. If a speed grade faster than the slow bin is required (step 107=No), wafers must be taken per step 109 from the bank that have been previously marked for a bin that meets the performance requirements for the application.

Over time, statistics for all wafers in a bin, including differences among wafers in the same boat and differences between similar boats, can be compiled and used to adjust the bin rating parameters.

Figure 2:
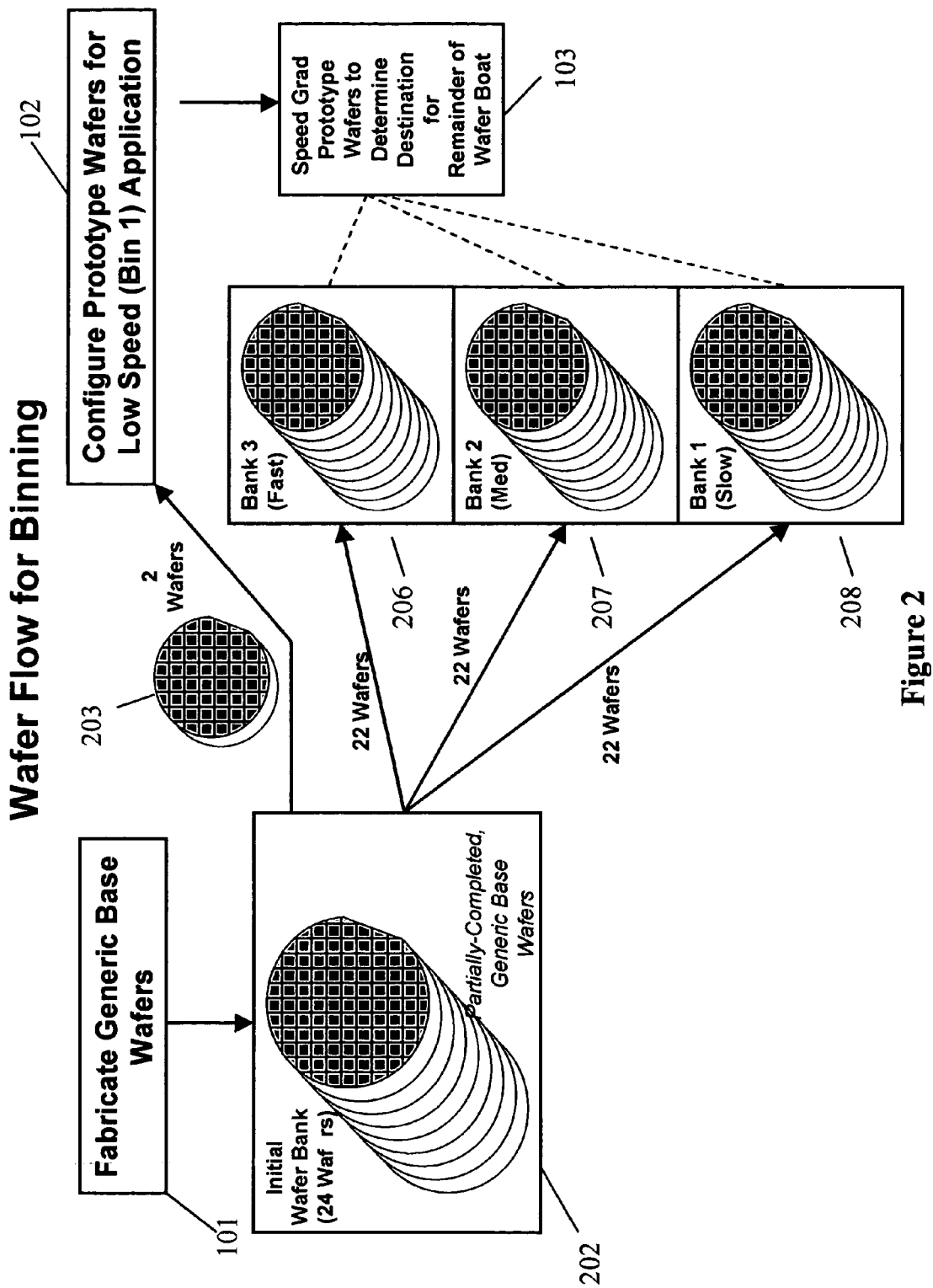
FIG. 2 shows an example wafer flow diagram for the binning method according to this invention.

FIG. 2 shows the actual flow of wafers according to a method within the scope of the present invention. First, a boat 202 of generic (un-customized) base wafers are fabricated 101 with the diffusion layers completed and in many cases, some number of metal layers also completed. To speed-grade this boat of wafers, a small number of wafers 203 is taken from the boat and processed 102 to completion targeting a customer application requiring only the lowest performance bin. These wafers 203 are then tested and speed-graded 103 to determine the performance level of the remainder of wafer boat 202. Subsequently, the remainder of wafer boat 202 is assigned to a characterized wafer bank to await a customer application. There may be any number N of speed grades (N=>2), however in the example shown in FIG. 2, there are three bins, low-speed bin 208, medium speed bin 207, and high speed bin 206.

Figure 3:
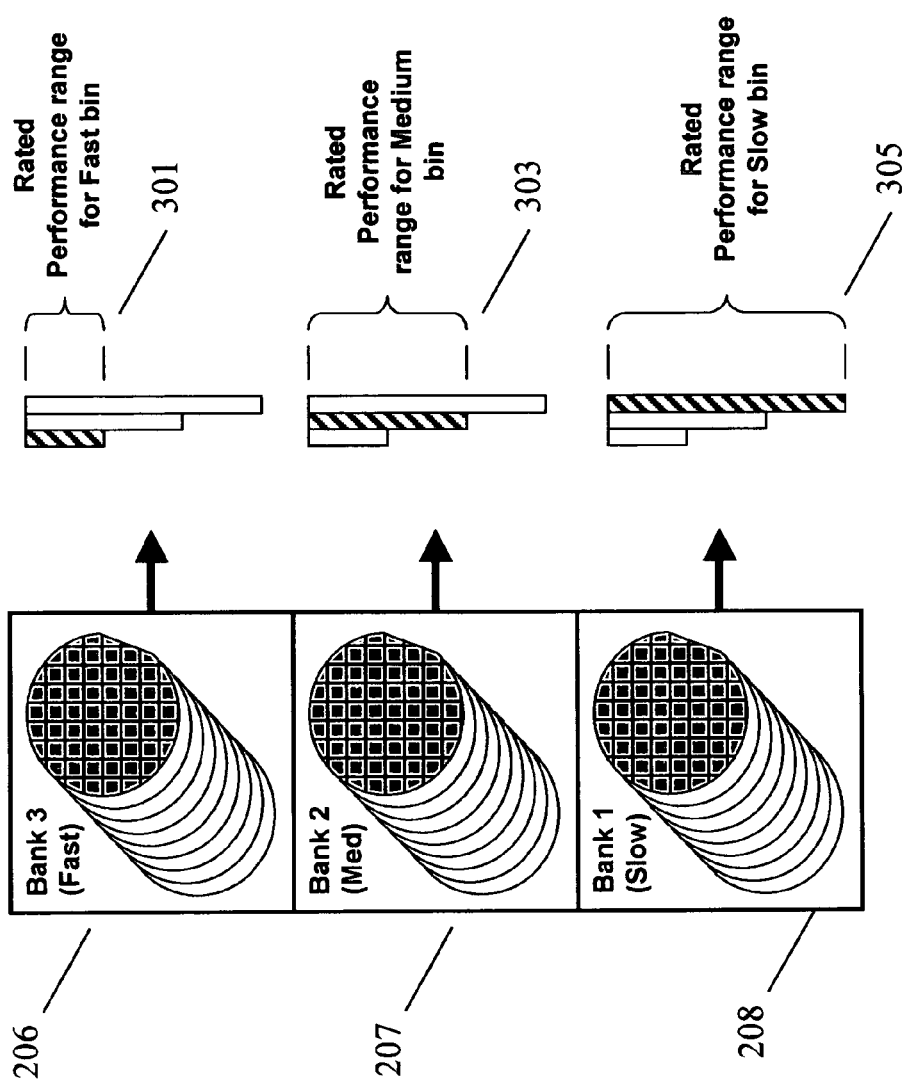
FIG. 3 shows how the performance of a customer design is simulated for specific performance bins.

FIG. 3 explains how the performance characteristics of the three bins of FIG. 2 correspond to the performance characteristics of the library used for the simulation and timing analysis operation 106. The fastest speed bin 206 is simulated for operation only in the highest performance range as shown 301. The medium range can be simulated in two ways—it can be simulated to operate in a range below the fastest bin and above the slowest bin, or alternately, it can be simulated as shown 303 such that a customer design requiring the medium speed bin 207 will also operate if a fast speed bin wafer 206 is used. Last, the slow performance range 305 can be simulated such that wafers of any performance characteristic (banks 207,207, or 208) can be utilized. This is, of course, useful since un-characterized wafers are often used for slow-bin applications, and wafers capable of medium and fast performance levels may be used as a result. Note that the breadth of performance range for all bins need not be the same. For instance, there could be only two bins, one with performance range 301 and the other with performance range 305.

FIG. 4 shows the "guard-band" 402 provided to make sure that a wafer will meet the required performance level for a particular bin even if it varies somewhat in performance from the initial wafer or wafers used to speed-grade the remainder of the bin. Notice that rated performance range 301 is larger than performance level 401 that was measured on the initial wafer(s) used to speed-grade the bin. This allows a wafer somewhat slower that that initially measured to be utilized while still meeting the performance requirement for the bin.

Therefore, methods and apparatus for binning semi-custom ASICs, have been described.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A method for binning semi-custom ASIC devices including the steps of:

fabricating a boat of partially completed generic base wafers lacking customizing masking layers applied during fabrication process to customize said wafers for a particular application, wherein processing steps are applied in the same timeframe to the generic base wafers in said boat; and taking at least one wafer from said boat of partially completed generic base wafers; and completing the fabrication process for said at least one wafer taken from said boat of partially completed generic base wafers where the customizing masking layers implement a design requiring the least restrictive bin relative to a parameter being considered; and testing said at least one wafer after completion of the fabrication process to determine which bin it corresponds to relative to the parameter being considered, wherein the testing of said wafer taken from the boat is done prior to completion of the fabrication process for the remaining partially completed wafers in said boat; and assigning the remaining un-customized and un-tested wafers in said boat of partially completed generic base wafers to a specific wafer bin according to the test results for said at least one wafer; and saving the remaining wafers in said boat of partially completed generic base wafers for use at a later time with designs that require parameters supported by the remaining wafers in said boat of partially completed generic base wafers.

2. The method of claim 1 further including the steps of:

simulating a new design compared to the rated parameter ranges for the available wafer bins to determine which bins are characterized with rated parameters that meet the requirements of the new design; and completing the processing for at least one previously assigned, un-customized wafer to customize the wafer for said new design, said un-customized wafer taken from a wafer bin whose rated parameters support the requirements of said new design.

3. The method of claim 2 where the rated parameter ranges for wafers in a particular bin are different than the parameter ranges measured during the testing step of claim 1, such that a guard band is provided.

4. The method of claim 1, where the parameter being considered is operational speed.

5. The method of claim 1, where the parameter being considered is power consumption.

6. A method for binning semi-custom ASIC devices including the steps of:

fabricating a boat of partially completed generic base wafers lacking customizing masking layers applied during fabrication process to customize said wafers for a particular application, wherein processing steps are applied in the same timeframe to the generic base wafers in said boat; and taking at least one wafer from said boat of partially completed generic base wafers; and completing the fabrication process for said at least one wafer taken from said boat of partially completed generic base wafers where the customizing masking layers implement a design requiring the least restrictive bin relative to a parameter being considered; and testing said at least one wafer after completion of the fabrication process to determine which bin it corresponds to relative to the parameter being considered, wherein the testing of said wafer taken from the boat is done prior to completion of the fabrication process for the remaining partially completed wafers in said boat; and assigning the remaining un-customized and un-tested wafers in said boat of partially completed generic base wafers to a specific wafer bin according to the test results for said at least one wafer; and saving the remaining wafers in said boat of partially completed generic base wafers for use at a later time with designs that require parameters supported by the remaining wafers in said boat of partially completed generic base wafers; and simulating a new design compared to the rated parameter ranges for the available wafer bins to determine which wafer bins are characterized with rated parameters that meet the requirements of the new design; and completing the processing for at least one previously assigned, un-customized wafer to customize the wafer for said new design, said un-customized wafer taken from a bin whose rated parameters support the requirements of said new design.

7. The method of claim 6, wherein the rated parameter ranges for wafers in a particular bin are different than the parameter ranges measured during the testing step such that a guard band is provided, and wherein the parameter being tested is operational speed.

8. A method for binning semi-custom ASIC devices, said method comprising:

fabricating a boat of partially completed generic base wafers lacking customizing masking layers applied during fabrication process to customize said wafers for a particular application, wherein processing steps are applied in the same timeframe to the generic base wafers in said boat; and taking at least two wafers from said boat of partially completed generic base wafers; and completing the fabrication process for said at least two wafers taken from said boat of partially completed generic base wafers where the customizing masking layers implement a design requiring the least restrictive bin relative to a parameter being considered; and testing each of said at least two wafers after completion of the fabrication process to determine which bin said at least two wafers correspond to relative to the parameter being considered, wherein the testing of each wafer taken from the boat is done prior to completion of the fabrication process for the remaining partially completed wafers in said boat; and determining a degree of deviation and a lowest performance level between said at least two wafers according to test results of testing each of said at least two wafers; and assigning the remaining un-customized and un-tested wafers in said boat of partially completed generic base wafers to a specific wafer bin associated with the lowest performance level determined from said test results; and saving the remaining wafers in said boat of partially completed generic base wafers for use at a later time with designs that require parameters supported by the lowest performance level.

9. The method of claim 8 further comprising:
simulating a new design compared to the rated parameter ranges for the available wafer bins to determine which bins are characterized with rated parameters that meet the requirements of the new design; and
completing the processing for at least one previously assigned, un-customized wafer to customize the wafer for said new design, said un-customized wafer taken from a wafer bin whose rated parameters support the requirements of said new design.

* * * * *